United States Patent
Rangarajan et al.

(10) Patent No.: US 7,603,597 B2
(45) Date of Patent: Oct. 13, 2009

(54) TOLERATING MEMORY ERRORS BY HOT EJECTING PORTIONS OF MEMORY

(75) Inventors: Madhusudhan Rangarajan, Round Rock, TX (US); Frank L. Wu, Austin, TX (US); Allen C. Wynn, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 197 days.

(21) Appl. No.: 11/300,820

(22) Filed: Dec. 15, 2005

(65) Prior Publication Data

US 2007/0143646 A1 Jun. 21, 2007

(51) Int. Cl.
G11C 29/00 (2006.01)

(52) U.S. Cl. .................................... 714/723
(58) Field of Classification Search ................ 714/718, 714/723
See application file for complete search history.

(56) References Cited

U.S. PATENT DOCUMENTS

| | | | | |
|---|---|---|---|---|
| 4,922,451 A * | 5/1990 | Lo et al. | ........................ | 714/8 |
| 5,561,627 A * | 10/1996 | Matsubara et al. | ..... | 365/185.04 |
| 6,691,264 B2 * | 2/2004 | Huang | ........................ | 714/723 |
| 6,769,081 B1 * | 7/2004 | Parulkar | ..................... | 714/733 |
| 6,904,546 B2 * | 6/2005 | Wu et al. | ....................... | 714/44 |
| 6,966,012 B1 * | 11/2005 | Gandhi | .......................... | 714/7 |
| 7,043,666 B2 * | 5/2006 | Wynn et al. | .................... | 714/8 |
| 7,076,686 B2 * | 7/2006 | La Fetra | ........................ | 714/6 |
| 7,114,024 B2 * | 9/2006 | Herbst | ........................ | 711/100 |
| 2001/0042225 A1 * | 11/2001 | Cepulis et al. | ................ | 714/25 |
| 2002/0184557 A1 * | 12/2002 | Hughes et al. | ................. | 714/8 |
| 2004/0153903 A1 * | 8/2004 | Ditewig et al. | .............. | 714/710 |
| 2004/0255224 A1 * | 12/2004 | Yabe | ......................... | 714/763 |
| 2005/0022066 A1 * | 1/2005 | Herbst | ........................ | 714/42 |
| 2005/0060603 A1 * | 3/2005 | Pomaranski et al. | ........... | 714/7 |
| 2005/0081093 A1 * | 4/2005 | Joly et al. | ....................... | 714/8 |
| 2005/0160326 A1 * | 7/2005 | Boatright et al. | .............. | 714/47 |
| 2005/0235124 A1 * | 10/2005 | Pomaranski et al. | ........ | 711/170 |
| 2005/0268196 A1 * | 12/2005 | Chang et al. | ................ | 714/742 |

* cited by examiner

Primary Examiner—Cynthia Britt
(74) Attorney, Agent, or Firm—Baker Botts L.L.P.

(57) ABSTRACT

In an information handling system, when a memory location is accessed and there is a bit error detected in that memory location then the memory location is logged into an error-log. The memory locations of the logged bit errors stored in the error-log are evaluated to determine whether there is one or more bit errors in a particular memory range, e.g., a contiguous range of memory locations. If there is one or more bit errors in a memory range, then that memory range may be hot ejected, e.g., disabled from use by the operating system. The bit error may be single bit error and/or multiple bit errors of a memory location.

30 Claims, 2 Drawing Sheets

TOLERATING MEMORY ERRORS BY HOT EJECTING PORTIONS OF MEMORY

TECHNICAL FIELD

The present disclosure relates generally to information handling systems and, more particularly, to dealing with memory errors in the information handling systems.

BACKGROUND

As the value and use of information continues to increase, individuals and businesses seek additional ways to process and store information. One option available to users are information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems, e.g., computer, personal computer workstation, portable computer, computer server, print server, network router, network hub, network switch, storage area network disk array, RAID disk system and telecommunications switch.

Information handling systems have memories, e.g., random access memory (RAM) cache memory, etc., for storing critical information and program instructions. The memory may experience single-bit errors at some locations. These single bit errors may be detected, logged and the error occurrence displayed as a memory error message on a maintenance status display, e.g., information handling system front panel liquid crystal display (LCD). If the information handling system supports spare bank/spare row, the system may switch to a different dual inline memory module (DIMM) after a certain number of single-bit errors are detected in an in-service DIMM. However, for information handling systems that do not support spare bank/spare row memory swapping, there are only a few options to continue reliable memory operation. The DIMM having excessive single-bit errors may be removed, resulting in less memory in the information handling system, and/or swapping the defective DIMM with a good DIMM. Either option may require hardware/chipset support and operator/administrator intervention.

SUMMARY

In an information handling system, bad memory, e.g., DIMM, may be ejected by using Advanced Configuration and Power Interface (ACPI) hot-eject methods, e.g., typically hot-eject DIMMs may be advertised to the operating system (OS) in the ACPI table as individual memory devices with their own EJ0 (Eject) method, STA (Add) method, etc. However, this results in an entire DIMM being taken out of service.

What is needed is the ability to take out of service only those portions of a DIMM that may be defective, e.g., at least one single bit error detected.

The memory may be logically divided into smaller memory ranges (segments) instead of a per DIMM or per memory card basis. For example, in an information handling system that may support 4 gigabytes (GB) of memory, the memory devices in the ACPI table may be as follows: Device (M0) //0-32 megabytes (MB), Device(M1) //32-64 MB, Device(M2)//64-96 MB, . . . Device(Mx)//4064-4094 MB.

According to teachings of this disclosure, when a Basic Input-Output System (BIOS) error logging code detects one or more single bit errors happening within a certain memory range (segment), that memory range, e.g., 32 MB, 64 MB, $2^N$ MB, where N is a positive integer; may be hot-ejected so that the OS does not use that memory range anymore. This increases operational reliability of the memory until the defective DIMM may be replaced during the course of normally maintenance. Thus, only a small portion of the memory may be lost instead of an entire DIMM being taken out of service. This all may be accomplished without having to implement any hardware support, e.g., hot-plug, spare bank, memory mirroring, etc., since only a 'logical' hot-eject may be invoked so that the OS doesn't use that memory range anymore.

According to a specific example embodiment of this disclosure, an information handing system comprises a method for disabling a range of memory locations when at least one of the memory locations has a bit error, the method may comprise the steps of: defining a range of memory locations; determining whether any memory location in the range has a bit error; storing each memory location having the bit error in an error-log; and determining from the error-log whether there is at least one memory location in the range having the bit error, if so hot ejecting the range of memory locations from further use.

According to another specific example embodiment of this disclosure, an information handling system may comprise: a memory having a range of memory locations; a test program for determining whether any memory location in the range has a bit error; wherein each memory location having the bit error is stored in an error-log; and hot ejecting the range of memory locations from further use by the information handling system when the error-log has at least one memory location in the range having the bit error.

According to yet another specific example embodiment of this disclosure, an information handling system may comprise: a memory having a range of memory locations; circuit logic for determining whether any memory location in the range has a bit error; wherein each memory location having the bit error is stored in an error-log; and hot ejecting the range of memory locations from further use by the information handling system when the error-log has at least one memory location in the range having the bit error.

BRIEF DESCRIPTION OF THE DRAWINGS

A more complete understanding of the present disclosure thereof may be acquired by referring to the following description taken in conjunction with the accompanying drawings wherein.

Figure 1:
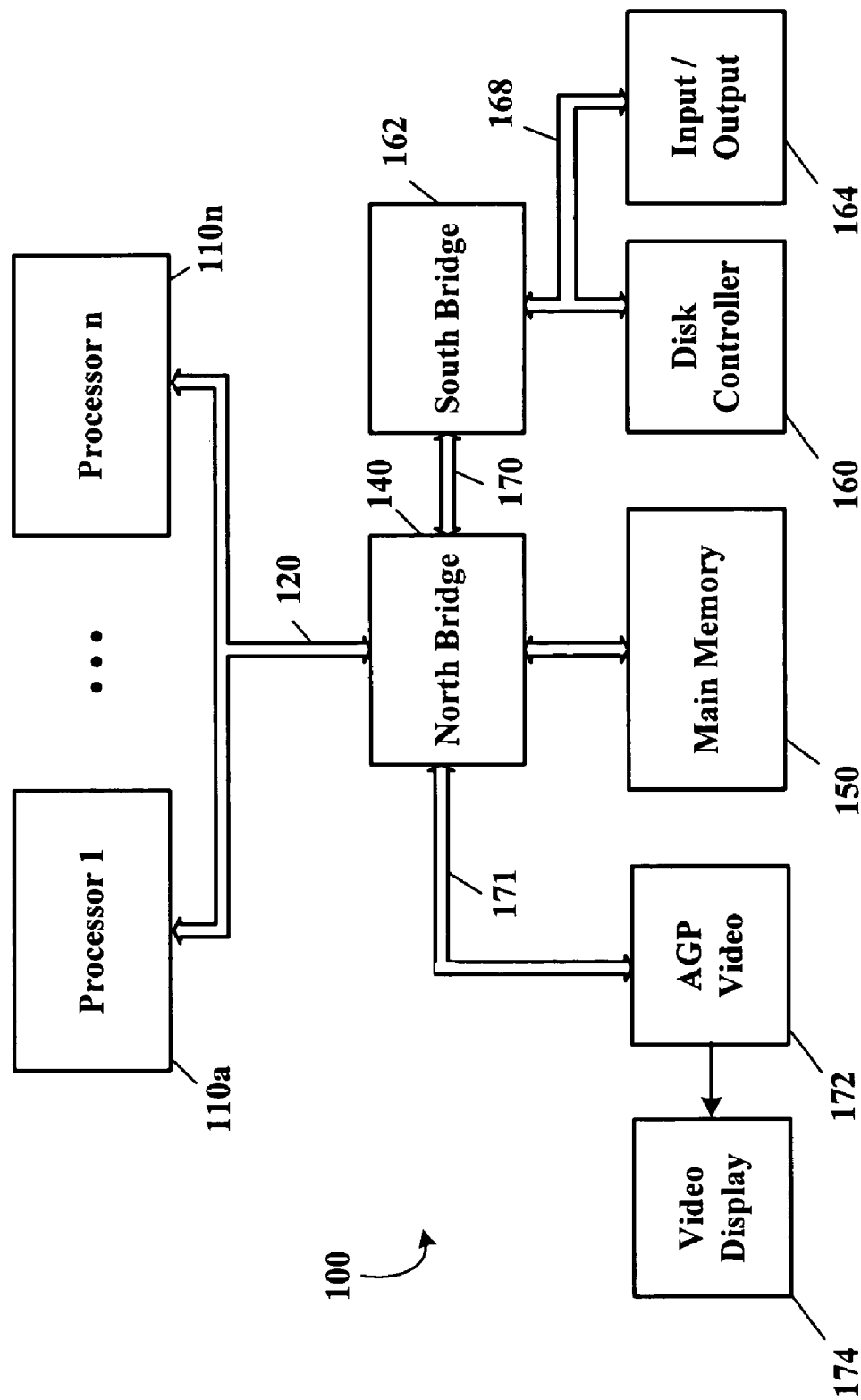
FIG. 1 is a schematic block diagram of an information handling system, according to specific example embodiments of the present disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU), hardware or software control logic, read only memory (ROM), and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring now to the drawings, the details of specific example embodiments of the present invention are schematically illustrated. Like elements in the drawings will be represented by like numbers, and similar elements will be represented by like numbers with a different lower case letter suffix.

Referring to FIG. 1, depicted is an information handling system having electronic components mounted on at least one printed circuit board (PCB) (motherboard) and communicating data and control signals therebetween over signal buses, according to a specific example embodiment of the present disclosure. In one example embodiment, the information handling system is a computer system. The information handling system, generally referenced by the numeral 100, comprises a plurality of physical processors 110, generally represented by processors 110a-110n, coupled to a host bus(es) 120. A north bridge 140, which may also be referred to as a memory controller hub or a memory controller, is coupled to a main system memory 150. The north bridge 140 is coupled to the plurality of processors 110 via the host bus(es) 120. The north bridge 140 is generally considered an application specific chip set that provides connectivity to various buses, and integrates other system functions such as a memory interface. For example, an Intel 820E and/or 815E chip set, available from the Intel Corporation of Santa Clara, Calif., provides at least a portion of the north bridge 140. The chip set may also be packaged as an application specific integrated circuit (ASIC). The north bridge 140 typically includes functionality to couple the main system memory 150 to other devices within the information handling system 100. Thus, memory controller functions such as main memory control functions typically reside in the north bridge 140. In addition, the north bridge 140 provides bus control to handle transfers between the host bus 120 and a second bus(es), e.g., PCI bus 170, AGP bus 171 coupled to a video graphics interface 172 which drives a video display 174. A third bus(es) 168 may also comprise other industry standard buses or proprietary buses, e.g., ISA, SCSI, I²C, SPI, USB buses through a south bridge (s) (bus interface) 162. A disk controller 160 and input/output interface(s) 164 may be coupled to the third bus(es) 168. The main memory 150 may comprise at least one memory module, e.g., dual inline memory module (DIMM), single inline memory module (SIMM), etc. It is contemplated and within the scope of this disclosure that a memory controller may also be built-in to a processor, and that the north bridge 140 and/or memory controller may have circuit logic for detecting a bit error in a memory location and sending out alarm information indicating the memory location(s) having the detected bit error.

Figure 2:
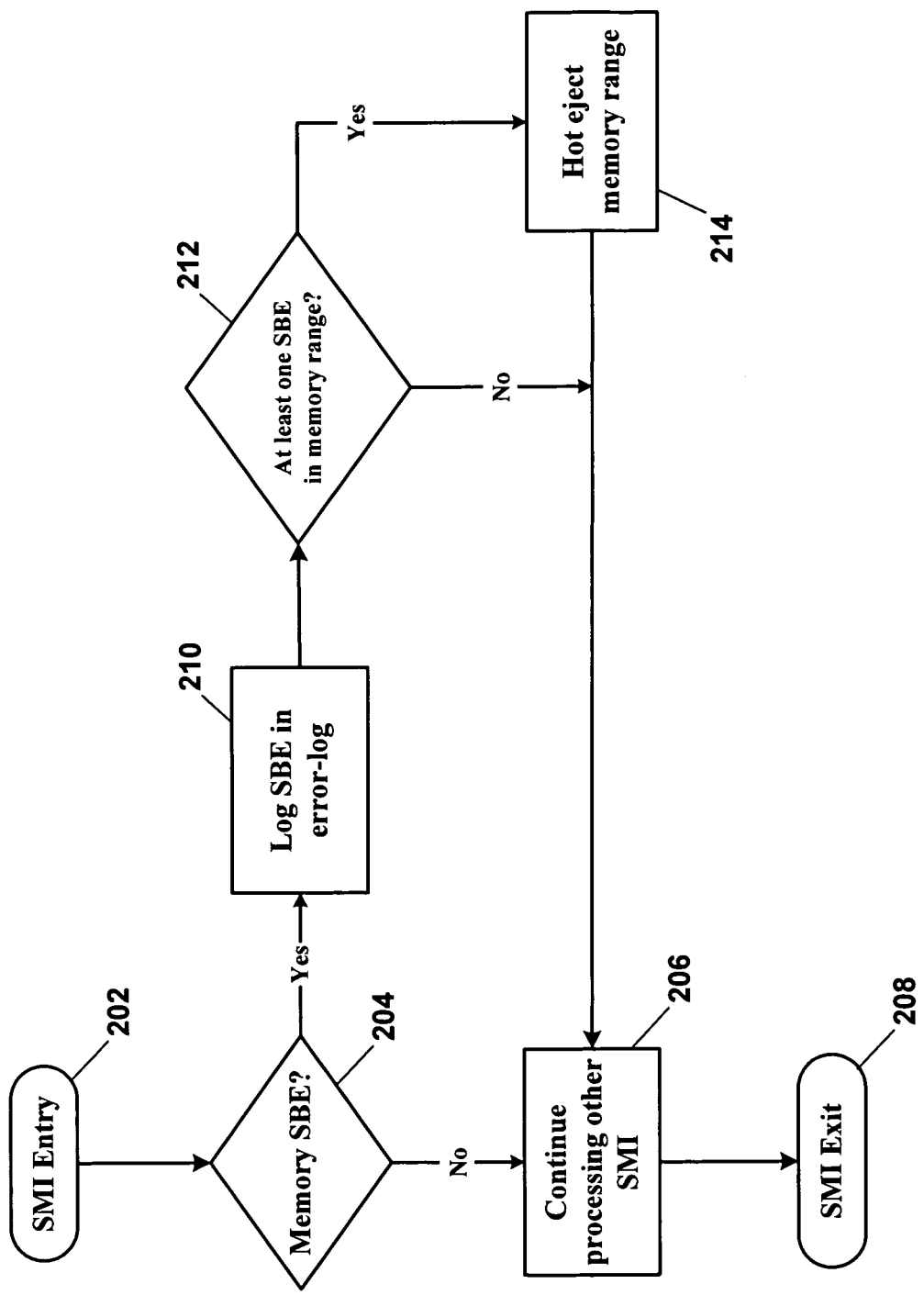
FIG. 2 is a flow diagram for single bit error logging of a plurality of memory ranges, according to a specific example embodiment of the present disclosure.

Referring to FIG. 2, depicted is a flow diagram for single bit error logging of a plurality of memory ranges, according to a specific example embodiment of the present disclosure. System Management Interrupt (SMI) is an interrupt in an x86 architecture that takes precedence over all other interrupts and is handled by the system BIOS A SMI is usually generated when there is some kind of event in the information handling system such as a single bit memory error. In step 202, entry of a SMI will initiate step 204 for determining whether there is a single bit error (SBE) in a memory location accessed by an OS, e.g., during a BIOS memory test of the information handling system memory 150. If no SBE is detected in step 204 then in step 206, other SMI entries are processed until in step 208 an exit from the SMI occurs. However, if there is a SBE detected in step 204 then in step 210 the SBE is logged into an error-log that stores the memory location of the SBE. Then in step 212, the memory locations of the logged SBEs stored in the error-log by step 210 are evaluated to determine whether there is one or more SBEs in a particular memory range, e.g., a contiguous range of memory locations, e.g., 32 MB, 64 MB, $2^N$ MB, where N is a positive integer. If so, then in step 214 that memory range may be hot ejected, e.g., disabled from use by the OS. It is contemplated and within the scope of this disclosure that more than one bit error in any memory location in a range may also be logged in the error-log and considered for purposes of determining whether a particular memory range should be hot ejected.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method for disabling a range of memory locations when at least one of the memory locations has a bit error, said method comprising the steps of:
   defining a range of memory locations;
   defining a storage location for storing each range of memory locations, wherein each range of memory locations is operable to be individually hot-ejected;
   advertising to the operating system each range of memory locations stored in the storage location;
   determining whether any memory location has a bit error;

storing each memory location having the bit error in an error-log; and determining from the error-log whether there is at least one individual memory device associated with the memory location having the bit error, if so hot ejecting the individual memory device from further use, wherein the hot ejected individual memory device is no longer accessible by an operating system.

2. The method according to claim 1, wherein the bit error is a single bit error.

3. The method according to claim 1, wherein the bit error is a multiple bit error.

4. The method according to claim 1, wherein the range of memory locations is 32 megabytes.

5. The method according to claim 1, wherein the range of memory locations is 64 megabytes.

6. The method according to claim 1, wherein the range of memory locations is $2^N$ megabytes, where N is a positive integer.

7. The method according to claim 1, wherein defining the range of memory locations comprises:

defining a plurality of ranges of memory locations.

8. The method according to claim 7, wherein each range of the plurality of ranges of memory locations is 32 megabytes.

9. The method according to claim 7, wherein each range of the plurality of ranges of memory locations is 64 megabytes.

10. The method according to claim 7, wherein each range of the plurality of ranges of memory locations is $2^N$ megabytes, where N is a positive integer.

11. The method according to claim 1, wherein the range of memory locations is accessed in accordance with a storage management initiative specification.

12. The method according to claim 1, wherein the step of determining whether any memory location in the range has a bit error is performed during a basic input-output system memory test.

13. The method according to claim 1, wherein the range of memory locations are part of an information handling system.

14. An information handling system, said system comprising:

a memory having a range of memory locations;

a storage location for storing each range, wherein the storage location is operable to advertise to the information handling system each stored range as an individual memory device;

a test program for determining whether any memory location has a bit error;

wherein each memory location having the bit error is stored in an error-log; and hot ejecting the individual memory device from further use by the information handling system when the error-log has at least one memory location associated with the individual memory device having the bit error, wherein the hot ejected individual memory device is no longer accessible by an operating system of the information handling system.

15. The information handling system according to claim 14, wherein the bit error is a single bit error.

16. The information handling system according to claim 14, wherein the bit error is a multiple bit error.

17. The information handling system according to claim 14, wherein the range of memory locations is 32 megabytes.

18. The information handling system according to claim 14, wherein defining the range of memory locations comprises:

defining a plurality of ranges of memory locations.

19. The information handling system according to claim 18, wherein each range of the plurality of ranges of memory locations is 32 megabytes.

20. The information handling system according to claim 18, wherein each range of the plurality of ranges of memory locations is 64 megabytes.

21. The information handling system according to claim 18, wherein each range of the plurality of ranges of memory locations is $2^N$ megabytes, where N is a positive integer.

22. The information handling system according to claim 18, wherein the plurality of ranges of memory locations are in at least one memory module.

23. The information handling system according to claim 22, wherein the at least one memory module is at least one dual inline memory module (DIMM).

24. The information handling system according to claim 22, wherein the at least one memory module is at least one single inline memory module (SIMM).

25. The information handling system according to claim 14, wherein the range of memory locations is accessed in accordance with a storage management initiative specification.

26. The information handling system according to claim 14, wherein memory location bit errors are determined during a basic input-output system memory test.

27. An information handling system, said system comprising:

a memory having a range of memory location;

a storage location for storing each range, wherein the storage location is operable to advertise to the information handling system each stored range as an individual memory device;

circuit logic for determining whether any memory location has a bit error;

wherein each memory location having the bit error is stored in an error-log; and hot ejecting the individual memory device from further use by the information handling system when the error-log has at least one memory location associated with the individual memory device having the bit error, wherein the hot ejected individual memory device is no longer accessible by an operating system.

28. The information handling system according to claim 27, wherein the range of memory locations is $2^N$ megabytes, where N is a positive integer.

29. The information handling system according to claim 27, wherein defining the range of memory locations comprises:

defining a plurality of ranges of memory locations.

30. The information handling system according to claim 29, wherein each range of the plurality of ranges of memory locations is $2^N$ megabytes, where N is a positive integer.

* * * * *

UNITED STATES PATENT AND TRADEMARK OFFICE
CERTIFICATE OF CORRECTION

PATENT NO. : 7,603,597 B2  Page 1 of 1
APPLICATION NO. : 11/300820
DATED : October 13, 2009
INVENTOR(S) : Rangarajan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 203 days.

Signed and Sealed this

Fifth Day of October, 2010

David J. Kappos
*Director of the United States Patent and Trademark Office*